(12) United States Patent
Reid et al.

(10) Patent No.: US 10,134,986 B2
(45) Date of Patent: Nov. 20, 2018

(54) CORRELATED ELECTRON MATERIAL DEVICES USING DOPANT SPECIES DIFFUSED FROM NEARBY STRUCTURES

(71) Applicant: ARM, Ltd., Cambridge (GB)

(72) Inventors: Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/201,932

(22) Filed: Jul. 5, 2016

(65) Prior Publication Data

US 2018/0013062 A1  Jan. 11, 2018

(51) Int. Cl.
| | | |
|---|---|---|
| H01L 29/10 | (2006.01) | |
| H01L 49/00 | (2006.01) | |
| H01L 45/00 | (2006.01) | |

(52) U.S. Cl.
CPC ............ *H01L 49/003* (2013.01); *H01L 45/04* (2013.01); *H01L 45/146* (2013.01); *H01L 45/16* (2013.01); *H01L 45/1658* (2013.01)

(58) Field of Classification Search
CPC .... H01L 49/003; H01L 27/2427; H01L 29/08
USPC .......................................................... 257/43
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz de Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106926 A1* | 5/2008 | Brubaker ............ H01L 27/2409 365/148 |
| 2008/0107801 A1 | 5/2008 | Celinska et al. | |
| 2012/0074372 A1 | 3/2012 | Yang et al. | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2016/0163978 A1 | 6/2016 | Paz De Araujo et al. | |
| 2017/0033782 A1 | 2/2017 | Shifren et al. | |

(Continued)

FOREIGN PATENT DOCUMENTS

| | | |
|---|---|---|
| CN | 101515630 A | 8/2009 |
| WO | 2008058264 A2 | 5/2008 |
| WO | 2013012423 A1 | 1/2013 |

OTHER PUBLICATIONS

Notification of Transmittal of the International Search Report and the Written Opinion of the International Searching Authority, or Declaration, App. No, PCT/GB2017/051976, dated Sep. 29, 2017, 18 Pages.

(Continued)

*Primary Examiner* — Elias M Ullah
(74) *Attorney, Agent, or Firm* — Berkeley Law & Technology Group, LLP

(57) ABSTRACT

Subject matter disclosed herein may relate to fabrication of correlated electron materials used, for example, to perform a switching function. In embodiments, a correlated electron material may be doped using dopant species derived from one or more precursors utilized to fabricate nearby structures such as, for example, a conductive substrate or a conductive overlay.

14 Claims, 4 Drawing Sheets

(56) References Cited

U.S. PATENT DOCUMENTS

2017/0045905 A1  2/2017  Sandhu et al.
2017/0047116 A1  2/2017  Sandhu et al.
2017/0047919 A1  2/2017  Sandhu et al.
2017/0069378 A1  3/2017  Shifren et al.

OTHER PUBLICATIONS

Celinska, et al, "Operating Current Reduction in Nickle Oxide Correlated Electron Random Access Memories (cRAMs) Through Controlled Fabrication Processes,"Intergrated Ferroelectrics, 124:1, 105-111, DOI: 10.1080/10584587,2011.573731, Jun. 27, 2011, 8 Pages.

* cited by examiner

CORRELATED ELECTRON MATERIAL DEVICES USING DOPANT SPECIES DIFFUSED FROM NEARBY STRUCTURES

BACKGROUND

Field

This disclosure relates to correlated electron devices, and may relate, more particularly, to approaches toward fabricating correlated electron devices, such as may be used in switches, memory circuits, and so forth, exhibiting desirable impedance characteristics.

Information

Integrated circuit devices, such as electronic switching devices, for example, may be found in a wide range of electronic device types. For example, memory and/or logic devices may incorporate electronic switches suitable for use in computers, digital cameras, cellular telephones, tablet devices, personal digital assistants, and so forth. Factors related to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
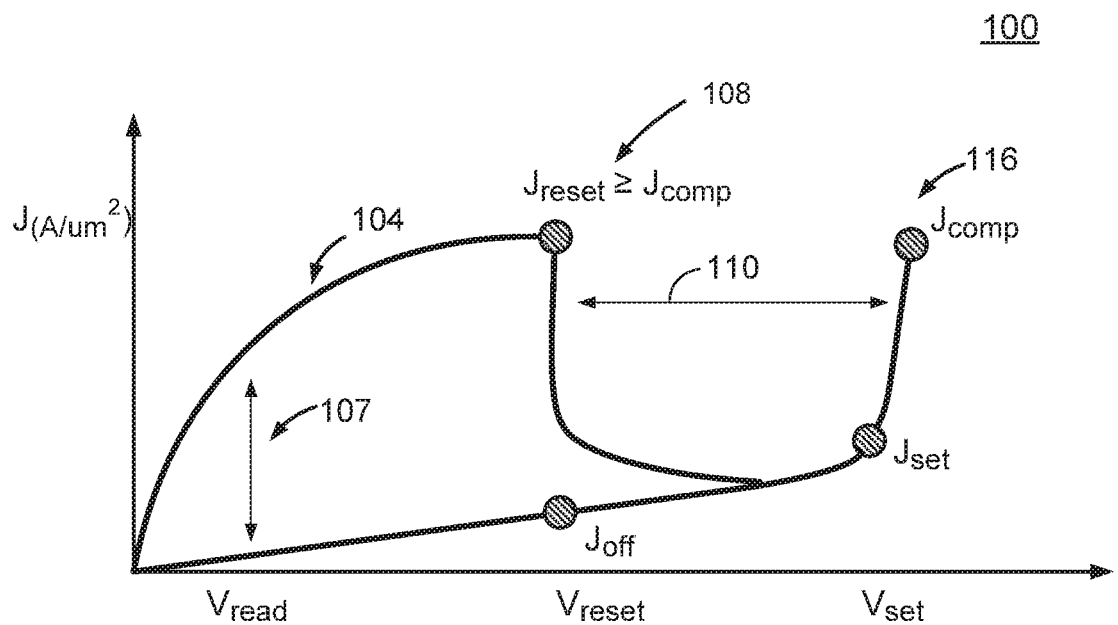
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) to form, for example, a correlated electron switch, such as may be utilized to form a correlated electron random access memory (CERAM) in memory and/or logic devices, for example. CEMs, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch may exhibit a substantially rapid conductor-to-insulator transition, which may be brought about by electron correlations rather than solid state structural phase changes, such as in response to a change from a crystalline state to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3}$ a≈0.26, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may comprise a "complex" impedance, which may include both resistive and capacitive components. For example, in a metal state, a CEM device may comprise a relatively low electric field that may approach zero, and therefore may exhibit a substantially low capacitance (e.g., relatively low complex impedance), which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state (e.g., relatively high complex impedance) to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect.

FIG. 1A is an illustration of an embodiment 100 of a current density versus voltage profile of a device formed from a CEM. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, which may establish and/or stabilize variable impedance properties. Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S) and others.

In another embodiment, the CEM device of FIG. 1A may comprise other transition metal oxide variable impedance materials, such as nitrogen-containing ligands, though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device, which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $\Delta_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

Figure 1B:
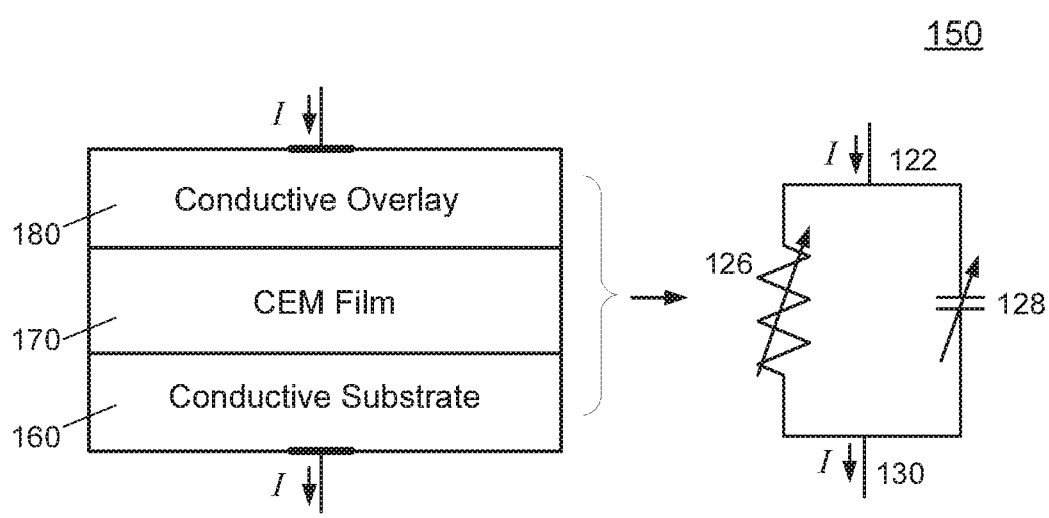
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as a device comprising a conductive substrate 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across the CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero, or very little, capacitance, and a higher capacitance state that is a function, at least in part, of a voltage applied across the CEM device.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $NiO_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or may occur responsive to use of a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO or NiO:$NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reaction, substantially in accordance with expression (4), below:

$$2Ni^{2+} \rightarrow Ni^{1+} + Ni^{3+} \qquad (4)$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a "dopant" such as a carbon-containing ligand, carbonyl (CO) or a nitrogen-containing ligand, such as an ammonia molecule ($NH_3$), may permit sharing of electrons during operation of the CEM device so as to give rise to the disproportionation reaction of expression (4), and its reversal, substantially in accordance with expression (5), below:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance state.

As the term is used herein, a "dominant" ligand may refer to a ligand that gives rise to a "p-type" CEM by way of back-donation with a metal ion as described in expression (4). Accordingly, in particular embodiments, a CEM material may be expressed in a metal-ligand form (ML) such as, for example, NiO in which Ni corresponds to the metal "M" and in which O corresponds to the ligand "L." In another example, such as a CEM utilizing vanadium oxide (VO), V may correspond to the metal "M" and "0" may correspond to the ligand "L."

In embodiments, depending on a molecular concentration of NiO:CO or NiO:$NH_3$, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO or NiO:$NH_3$ and other materials present in the CEM device, as well as other process variations, and claimed subject matter is not limited in this respect.

In certain embodiments, atomic layer deposition may be utilized to form or to fabricate films comprising nickel oxide materials, such as NiO:CO or NiO:$NH_3$, to permit electron back-donation during operation of the CEM device in a circuit environment, for example, to give rise to a low-impedance state. Also during operation in a circuit environment, for example, electron back-donation may be reversed so as to give rise to a substantially dissimilar impedance state, such as a high-impedance state, for example. In particular embodiments, atomic layer deposition may utilize two or more precursors to deposit components of, for example, NiO:CO or NiO:$NH_3$, or other transition metal oxide, transition metal, or combination thereof, onto a conductive substrate. In an embodiment, layers of a CEM device may be deposited utilizing separate precursor molecules, AX and BY, according to expression (6a), below:

$$AX_{(gas)} + BY_{(gas)} = AB_{(solid)} + XY_{(gas)} \qquad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tin, titanium, vanadium. In particular embodiments, compounds that comprise more than one transition metal oxide may also be utilized, such as yttrium titanate ($YTiO_3$).

In embodiments, "X" of expression (6a) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) ((thd)$_2$), acetyl acetonate (acac), bis(methylcyclopentadienyl) (($CH_3C_5H_4)_2$), dimethylglyoximate $(dmg)_2$, 2-amino-pent-2-en-4-onato $(apo)_2$, $(dmamb)_2$ where dmamb=1-dimethyl amino-2-methyl-2-butanolate, (dmamp)2 where dmamp=1-dimethyl amino-2-methyl-2-propanolate, Bis(pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl (Ni$(Cp)_2$), nickel diethylcyclopentadienyl (Ni$(EtCp)_2$), Bis(2,2,6,6-tetramethylheptane-3,5-dionato)Ni(II) (Ni$(thd)_2$), nickel acetyl acetonate (Ni(acac)$_2$), bis(methylcyclopentadienyl)nickel (Ni($CH_3C_5H_4)_2$, Nickel dimethylglyoximate (Ni$(dmg)_2$), Nickel 2-amino-pent-2-en-4-onato (Ni$(apo)_2$), Ni$(dmamb)_2$ where dmamb=1-dimethylamino-2-methyl-2-butanolate, Ni$(dmamp)_2$ where dmamp=1-dimethylamino-2-methyl-2-propanolate, Bis(pentamethylcyclopentadienyl) nickel (Ni$(C_5(CH_3)_5)_2$, and nickel carbonyl (Ni$(CO)_4$), just to name a few examples. In expression (6a), precursor "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer to form oxygen radicals.

However, in particular embodiments, a dopant in addition to precursors AX and BY may be utilized to form layers of the CEM device. An additional dopant ligand, which may co-flow with precursor AX, may permit formation of back-donating compounds, substantially in accordance with expression (6b), below. In embodiments, dopants such as ammonia ($NH_3$), methane ($CH_4$), carbon monoxide (CO), or other may be utilized, as may other ligands comprising carbon or nitrogen or the other dopants listed above. Thus, expression (6a) may be modified to include an additional dopant ligand substantially in accordance with expression (6b), below:

$$AX_{(gas)} + (NH_3 \text{ or other ligand comprising nitrogen}) + BY_{(gas)} = AB:NH_{3(solid)} + XY_{(gas)} \qquad (6b)$$

It should be noted that concentrations, such as atomic concentration, of precursors, such as AX, BY, and $NH_3$ (or other ligand comprising nitrogen) of expressions (6a) and (6b) may be adjusted so as to bring about a final atomic concentration of nitrogen or carbon dopant in a fabricated CEM device, such as in the form of ammonia ($NH_3$) or carbonyl (CO) of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition or the like, utilized in fabrication of CEM devices. In expressions (6a) and (6b), "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer (BY) to form oxygen radicals. Likewise, plasma may be used with the doping species to form an activated species that will control the doping concentration of the CEM.

In particular embodiments, such as embodiments utilizing atomic layer deposition, a CEM film may be exposed to precursors, such as AX and BY, as well as dopant species molecules (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:$NH_3$, for example, is performed, temperature ranges approximately in the range of 20.0° C. and 400.0° C. may be utilized. Responsive to exposure to precursor gases (e.g., AX, BY, $NH_3$ or other ligand comprising nitrogen), such gases may be purged from the heated chamber for durations approximately in the range of 0.5 seconds to 180.0 seconds. It should be noted, however, that these are merely examples of potentially suitable ranges of temperature and/or time and claimed subject matter is not limited in this respect.

In certain embodiments, a single two-precursor cycle (e.g., AX and BY, as described with reference to expression 6(a)) or a single three-precursor cycle (e.g., AX, $NH_3$ or other ligand comprising nitrogen, and BY, as described with reference to expression 6(b)) utilizing atomic layer deposition may bring about a CEM device layer comprising a thickness approximately in the range of 0.6 Å to 1.5 Å). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 1.5 Å, 300 to 350 two-precursor cycles, for example, may be performed. It should be noted that atomic layer deposition may be utilized to form CEM device films having other thicknesses, such as thicknesses approximately in the range of 1.5 nm to 150.0 nm, for example, and claimed subject matter is not limited in this respect.

In particular embodiments, responsive to one or more two-precursor cycles (e.g., AX and BY), or three-precursor cycles (AX, $NH_3$ or other ligand comprising nitrogen, and BY), of atomic layer deposition, a CEM device film may undergo in situ annealing, which may permit improvement of film properties or may be used to incorporate the material using nitrogen as a dopant species, such as in the form of ammonia, in the CEM device film. In certain embodiments, a chamber may be heated to a temperature approximately in the range of 20.0° C. to 1000.0° C. However, in other embodiments, in situ annealing may be performed utilizing temperatures approximately in the range of 150.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 2A:
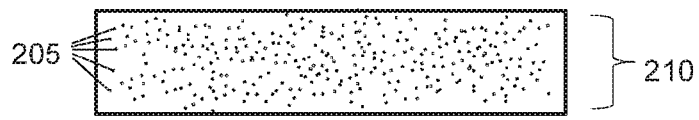
FIG. 2A is an illustration of an embodiment of a conductive substrate showing dopant species atoms.

FIG. 2A is an illustration of an embodiment 200 of a conductive substrate showing dopant species atoms. A conductive substrate, such as conductive substrate 210, for example, may comprise a titanium-based and/or titanium-containing substrate, such as titanium nitride (TiN), fabricated in layers, for example, for use in a CERAM device or other type of CEM-based device. In other embodiments, conductive substrate 210 may comprise other types of conductive materials, such as titanium nitride, platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive substrate material.

In embodiments, in which conductive substrate 210 comprises titanium nitride, for example, substrate 210 may be formed utilizing precursors such as titanium tetrachloride ($TiCl_4$), which may comprise chlorine as a potential dopant species as the chlorine atoms diffuse into a CEM. In another embodiment, a TiN substrate may be formed utilizing tetrakis dimethylamido titanium (TDMAT), tetrakis diethylamido titanium (TDEAT), and/or titanium isopropoxide (TTIP), which may comprise carbon as a dopant species as carbon atoms diffuse into the CEM. It should be noted that titanium-based and/or titanium-containing precursor materials may comprise dopant species in addition to chlorine and/or carbon and claimed subject matter is not limited in this respect. Precursors may be used with nitrogen (e.g., co-flow) as a dopant species in the form of $NH_3$.

In other embodiments, conductive substrate 210 may comprise a tantalum-based and/or a tantalum-containing material, such as tantalum nitride (TaN), formed in layers, for use in a CERAM device or other type of CEM-based device. In embodiments, a TaN substrate may be formed utilizing precursors such as pentakisdimethylamido tantalum (PDMAT), which may comprise carbon as a dopant species. In another embodiment, a TaN substrate may be formed utilizing tantalum ethoxide (TAETO), which may also comprise carbon as a dopant species. In another embodiment, a TaN substrate may be formed utilizing tantalum pentachloride ($TaCl_5$), which may comprise chlorine as a dopant species. It should be noted that tantalum-based and/or tantalum-containing precursor materials may comprise dopant species in addition to chlorine and/or carbon and claimed subject matter is not limited in this respect. Precursors may be used with nitrogen (e.g., co-flow) as a dopant species in the form of $NH_3$.

In other embodiments, conductive substrate 210 may comprise a tungsten-based and/or a tungsten-containing material formed in layers, such as tungsten-nitride (WN), for example, for use in a CERAM device or other type of CEM-based device. In embodiments, a WN substrate may be formed utilizing precursors such as tungsten hexacarbonyl ($W(CO)_6$) and/or cyclopentadienyltungsten(II) tricarbonyl hydride, both of which may comprise carbon as a dopant species. In another embodiment, a WN substrate may be formed utilizing triamminetungsten tricarbonyl (($NH_3$)3W $(CO)_3$) and/or tungsten pentacarbonyl methylbutylisonitrile ($W(CO)5(C_5H_{11}NC)$), both of which may comprise carbon or nitrogen as a dopant species. It should be noted that tungsten-based and/or tungsten precursor materials may comprise dopant species in addition to nitrogen and/or carbon and claimed subject matter is not limited in this respect. Precursors may be used with nitrogen (e.g., co-flow) as a dopant species in the form of $NH_3$.

Forming or fabricating conductive substrate 210 may involve a variety of processes, such as atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, and claimed subject matter is not limited in this respect.

In an example, which will be described further in reference to FIGS. 3A-3B, in a fabrication process involving TDMAT (tetrakis dimethylamido titanium), which may be utilized to form a TiN substrate, an amount of carbon may remain embedded within a fabricated substrate as shown by dopant species atoms 205. Carbon may be embedded in a TiN substrate in the form of, for example, one or more types of dopant species molecules, such as will be described further in reference to FIGS. 3A-3B. Thus, dopant species atoms 205 of FIG. 2A may represent carbon atoms that have decomposed from dopant species molecules embedded within substrate 210. In an embodiment, an amount of carbon dopant remaining in a TiN substrate may be manipulated, for example, by increasing an amount of TDMAT present in a deposition chamber. In other embodiments, a temperature utilized during a deposition process may be increased, which may influence decomposition, such as a rate of decomposition, of carbon from TDMAT. In other embodiments, a deposition process may utilize an increased pressure, which may operate to increase "residence time" of carbon, for example, in a deposition chamber, which may, in turn, increase an amount of carbon present in a fabricated substrate. As the term is used herein, "residence time" may refer to an amount of time that a precursor or other agent persists in a process chamber. Residence time may be increased in response to increasing pressure of a particular precursor, or other agent, and/or may be increased responsive response to an increase in a duration in which a precursor or other agent is present in a process chamber.

In another embodiment, in a fabrication process involving $TiCl_4$ (titanium tetrachloride), which may be utilized to form a TiN substrate, chlorine may remain embedded within substrate 210 in the form of one or more types of dopant species molecule. Thus, in such an embodiment, dopant species atoms 205 of FIG. 2A may represent chlorine atoms that have decomposed from dopant species molecules embedded within substrate 210. In an embodiment, an amount of chlorine, as a dopant species remaining in a TiN substrate, may be manipulated, for example, by increasing an amount of $TiCl_4$ present in a deposition chamber. In other embodiments, a temperature utilized during a deposition process may be increased, which may influence decomposition, such as a rate of decomposition, of chlorine from a $TiCl_4$ precursor, for example.

Figure 2B:
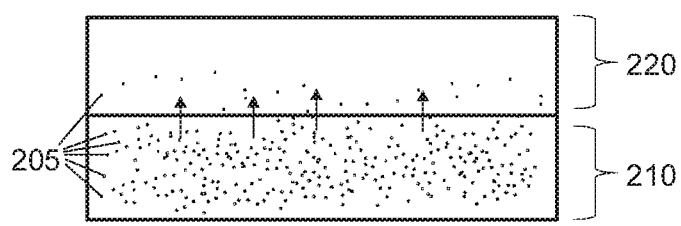
FIG. 2B is an illustration of an embodiment of a correlated electron material receiving dopant species atoms responsive to doping of the conductive substrate.

FIG. 2B is an illustration of an embodiment 225 of a correlated electron material receiving dopant species atoms responsive to decomposition of a precursor used to form a conductive substrate. As shown in FIG. 2B, if CEM film 220 is formed over conductive substrate 210, an amount of dopant species atoms 205 may diffuse from conductive substrate into CEM film 220. In particular embodiments, top layers of conductive substrate 210 (e.g., layers closer to CEM film 220) may be fabricated using a higher concentration of dopant-containing precursors, which may operate to make available additional dopant species atoms at layers only a small distance from CEM film 220.

In embodiments, diffusion of dopant species atoms 205 may be assisted by annealing a CEM film deposited over conductive substrate 210 at an elevated temperature, such as a temperature approximately in the range of 20° C. to 1000° C., for example. Annealing may operate to accelerate decomposition of dopant species atoms from dopant species molecules remaining within conductive substrate 210. Annealing may additionally operate to mend grain boundaries of a conductive substrate, which may permit increased migration of dopant species atoms, such as chlorine, carbon, and nitrogen, for example, across adjacent grain boundaries. Annealing may also operate to increase pathways for dopant species atoms diffusing from conductive substrate 210 to CEM film 220 in other ways, and claimed subject matter is not limited in this respect.

In particular embodiments, dopant species atoms and/or molecules, such as nitrogen, chlorine, carbon, carbonyl, nitrosyl, and so forth, may represent impurities that operate to adversely affect electrical performance of conductive substrate 210. For example, additional carbon embedded in conductive substrate 210 may operate to decrease conductivity (increase resistance) of conductive substrate 210. Accordingly, typical processes for preparing conductive substrates may place emphasis on removing carbon from conductive substrates. Other processes may place emphasis on removing other impurities from conductive substrates such as, for example, chlorine and nitrogen. In addition to potentially adversely affecting electrical conductivity of the substrate, impurities may also give rise to charge trapping, which may increase parasitic capacitance of conductive substrates. However, as will also be discussed further in reference to FIGS. 3A-3B, such impurities in conductive substrates may enhance electrical performance of CEM films such as, for example, by operating to bring about back-donation of electrons of compounds comprising NiO which may comprise, for example, CEM film 220.

Figure 2C:
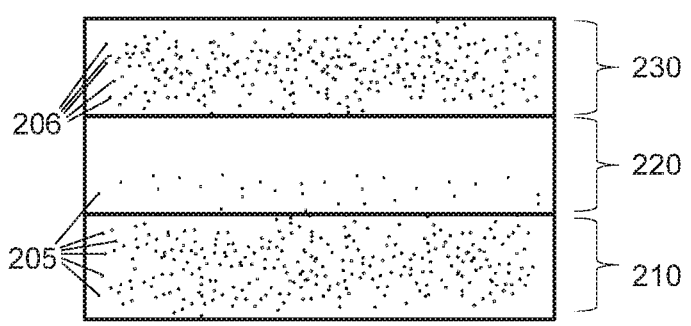
FIG. 2C is an illustration of an embodiment of a conductive substrate deposited over a correlated electron material (CEM) film.

FIG. 2C is an illustration of an embodiment 250 of a conductive overlay deposited over a CEM film. In embodiments, conductive overlay 230 may comprise one or more materials similar to those comprising conductive substrate 210, such as one or more materials selected from a group comprising aluminum, cadmium, chromium, cobalt, copper, gold, iron, etc., and claimed subject matter is not limited in this respect. After fabrication of conductive overlay 230, one or more types of dopant species molecules, and/or dopant species atoms derived from one or more dopant species molecules, for example, may remain within conductive substrate 230. Thus, similar to fabrication of conductive substrate 210, a fabrication process involving $TiCl_4$, which may be utilized to form conductive overlay 230, may give rise to chlorine dopant species responsive to decomposition of dopant species molecules derived from $TiCl_4$.

In FIG. 2C, chlorine atoms, which may be formed responsive to decomposition of $TiCl_4$, for example, are shown as dopant species atoms 206. In an embodiment, an amount of chlorine remaining in a conductive overlay comprising TiN may be manipulated, for example, by increasing an amount of $TiCl_4$ present in a deposition chamber utilized during the formation of conductive overlay 230. In other embodiments, a temperature utilized during a deposition process may be increased, which may influence a rate of decomposition of chlorine from a $TiCl_4$ precursor. In other embodiments, residence time of chlorine present in a fabricated substrate may be increased so as to increase presence of chlorine, for example, embedded in a fabricated conductive overlay 230.

Figure 2D:
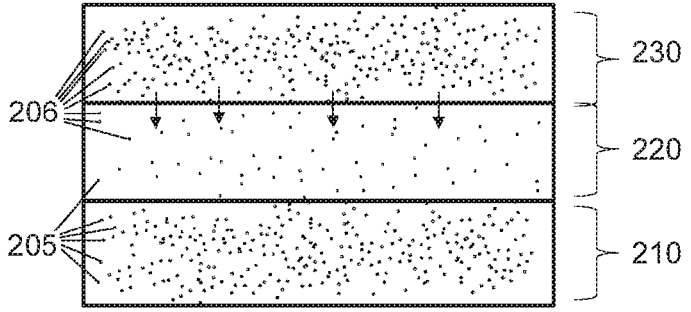
FIG. 2D is an illustration of an embodiment of a correlated electron material receiving dopant species atoms responsive to doping of the conductive overlay.

FIG. 2D is an illustration of an embodiment 275 of a CEM film receiving dopant species atoms responsive to decomposition of precursors used to form a conductive substrate and a conductive overlay. As shown in FIG. 2D, if conductive overlay 230 is formed over CEM film 220, an amount of dopant species atoms 206 may diffuse from conductive overlay 230 into CEM film 220. In particular embodiments, top layers of conductive overlay 230 may be fabricated using a higher concentration of dopant-containing precursors, which may operate to make available additional dopant species atoms at layers only a small distance from CEM film 220. In embodiments, diffusion of dopant species atoms 206 may be assisted by annealing a conductive overlay and CEM film deposited over conductive substrate 210 at elevated temperature, for example, which may operate to accelerate decomposition of dopant species atoms from a dopant species molecules remaining within conductive overlay 230. Annealing may additionally operate to mend grain boundaries of a conductive overlay, which may permit increased migration of dopant species atoms, such as chlorine, carbon, and nitrogen, for example, across adjacent grain boundaries. Annealing may increase pathways for dopant species atoms diffusing from conductive overlay 230 to CEM film 220 in other ways, and claimed subject matter is not limited in this respect.

Figure 3A:
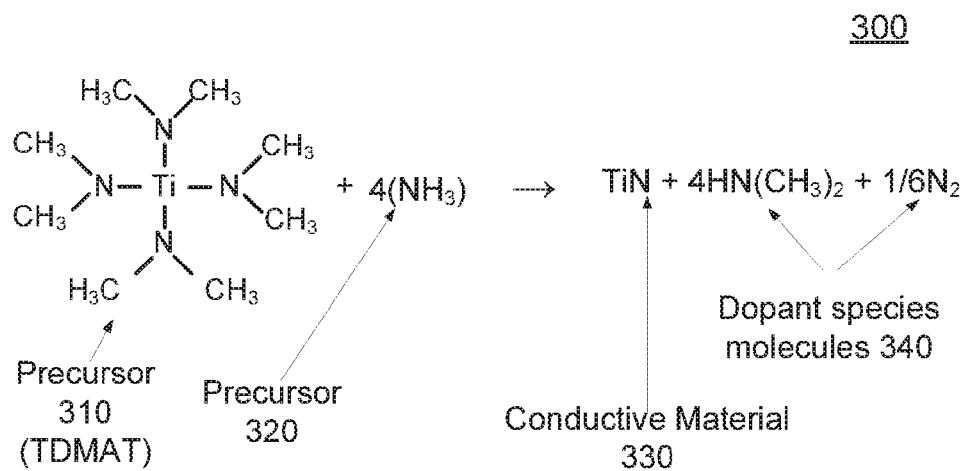
FIG. 3A is an illustration of an embodiment of an example precursor, utilized to form a conductive substrate material, along with one or more types of dopant species molecules.
Figure 3B:
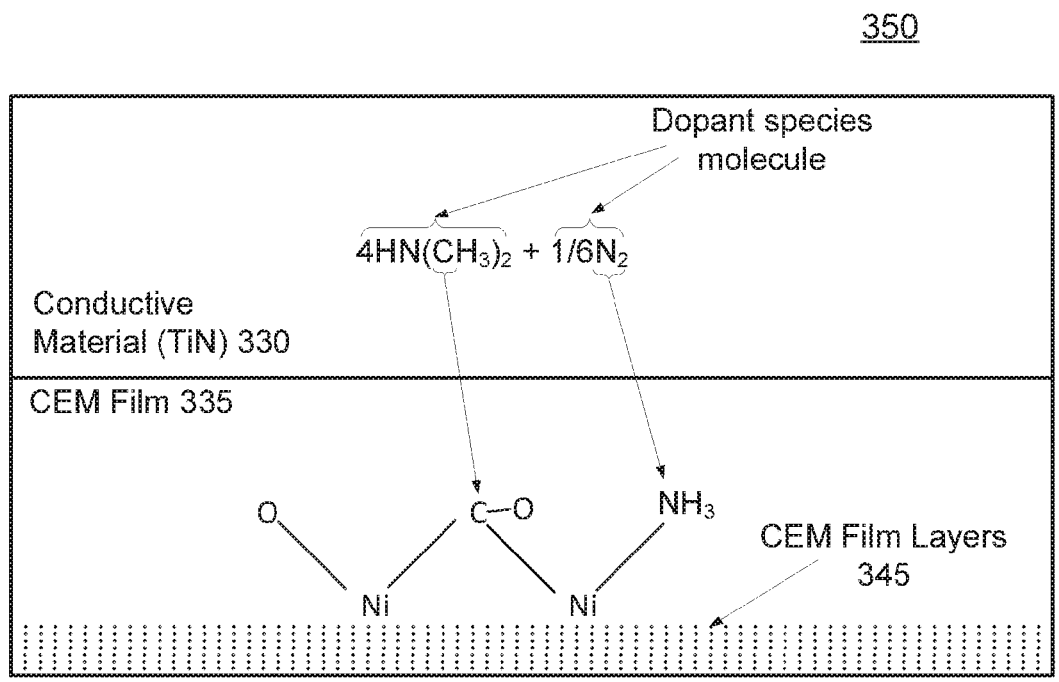
FIG. 3B is an illustration of an embodiment of dopant species molecules embedded in a conductive material diffusing to a CEM film.

FIG. 3A-3B is an illustration of an embodiment 300 of precursors, which may be utilized to form a conductive substrate along with one or more types of dopant species molecules. In FIG. 3A, precursor 310 corresponds to a TDMAT molecule, which may be utilized to form a TiN substrate, such as substrate 210, of FIG. 2A, or may be utilized to form a conductive overlay, such as conductive overlay 230. In FIG. 3A, a nitrogen dopant species molecule in the form of $NH_3$, may be utilized in a co-flow process in which a conductive substrate or a conductive overlay, for example, may be formed in layers by way of a deposition process. Precursors 310 and 320 may be utilized in an atomic layer deposition process or other suitable process utilized to form a TiN substrate, for example, and claimed subject matter is not limited in this respect. A deposition process, for example, may bring about formation of layers of conductive material 330, which may comprise TiN as shown in FIG. 3A. In other embodiments, however, substrate material 330 may comprise a variety of other materials, such as titanium nitride, platinum, titanium, copper, aluminum, cobalt, nickel, tungsten, tungsten nitride, cobalt silicide etc., and claimed subject matter is intended to embrace all types of conductive materials that may be used with correlated electron materials, for example.

After fabrication of substrate material 330, for example, dopant species molecules 340 may remain embedded within substrate material 330. In the embodiment of FIG. 3A, dopant species molecules 340 may comprise a gas, such as nitrogen ($N_2$) and surface carbon-containing species $4HN(CH_3)_2$, for example. It should be noted that other precursors may be utilized to fabricate other types of conductive materials, such as TDMAT, TDEAT, TTIP, PDMAT, TAETO, $TaCl_5$, $W(CO)_6$, $(NH_3)3W(CO)_3$, $W(CO)5(C_5H_{11}NC)$, for example, and claimed subject matter is not limited in this respect. Precursors utilized to fabricate other types of conductive materials may bring about dopant species molecules other than dopant species molecules 340 of FIG. 3.

FIG. 3B is an illustration of an embodiment 350 of dopant species molecules embedded in a conductive material diffusing into a CEM film. In FIG. 3B, carbon dopant species atoms are shown diffusing from a dopant species molecule $(4HN(CH_3)_2)$ into a CEM film 335 comprising NiO. In particular embodiments, diffusion of carbon dopant species atoms may permit formation of carbonyl (CO), which may operate to fill oxygen vacancies in, for example, a CEM films comprising NiO to form NiO:CO. Such filling of oxygen vacancies, for example, in CEM film layers 345, may bring about electron back-donation in a CEM film. Back-donation may be reversed, in a CEM film comprising nickel oxide, for example, (e.g., NiO:CO), which may thereby permit the CEM film to switch to exhibiting a high-impedance property during device operation. Likewise, in FIG. 3B nitrogen dopant species atoms are shown diffusing from a dopant species molecule ($N_2$) to form $NH_3$, which may operate to fill oxygen vacancies in CEM film layers 345 of a CEM film comprising NiO, to form NiO:$NH_3$. In certain embodiments, back-donation in a correlated electron material, for example, may occur responsive to use of nitrogen as a dopant species in the form of ammonia ($NH_3$), for example. As previously described herein, electron back-donation may bring about controllable and reversible donation of electrons to a conduction band of a transition metal or transition metal oxide, such as nickel, for example, during operation.

Figure 4:
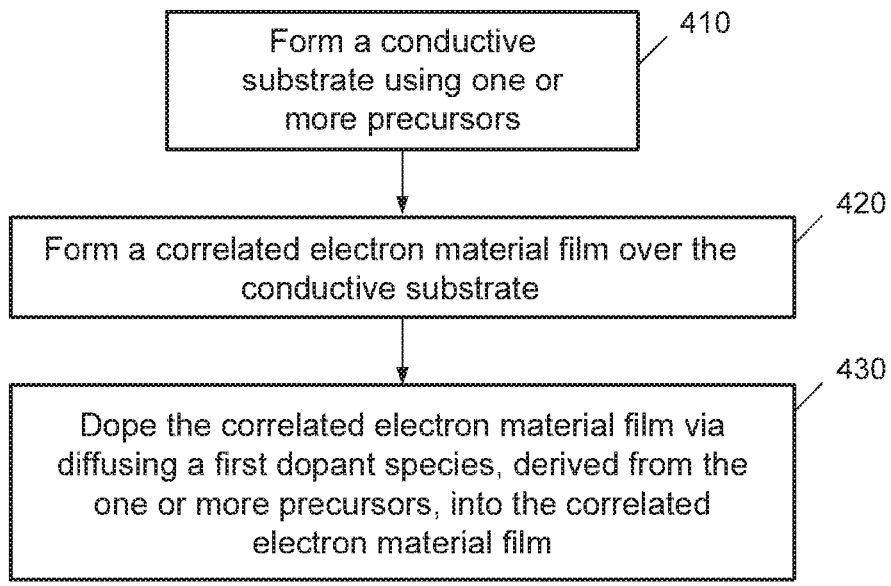
FIGS. 4 and 5 are flowcharts of embodiments for generalized processes for fabricating a correlated electron material with reduced interfacial layer impedance.

FIG. 4 is a flowchart of an embodiment 400 for a generalized process for fabricating correlated electron materials with reduced interfacial layer impedance. Example implementations, such as described in FIG. 4, and other figures described herein, may include blocks in addition to those shown and described, fewer blocks, or blocks occurring in an order different than may be identified, or any combination thereof. Embodiment 400 may begin at block 410, which may comprise forming a conductive substrate using one or more precursors. At block 410, a substrate, such as a conductive substrate comprising TiN may be formed. In other embodiments, a conductive substrate may comprise platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof. A conductive substrate formed at block 410 may involve a variety of processes, such as atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices.

At block 420, a CEM film may be formed over the conductive substrate. A CEM film may comprise a transition metal oxide comprising nickel, for example, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tin, titanium, vanadium. In particular embodiments, compounds that comprise more than one transition metal oxide may also be utilized, such as yttrium titanate ($YTiO_3$).

Block 430 may comprise doping a CEM film via diffusing a first dopant species, derived from the one or more precursors, into the CEM film. Doping may include annealing a CEM film, which may operate to mend grain boundaries of a conductive substrate to permit increased migration of dopant species atoms, such as chlorine, carbon, and nitrogen, or molecular combinations, for example, across adjacent grain boundaries. Annealing may increase pathways for dopant species diffusing from a conductive substrate to a CEM film in other ways, and claimed subject matter is not limited in this respect.

Figure 5:
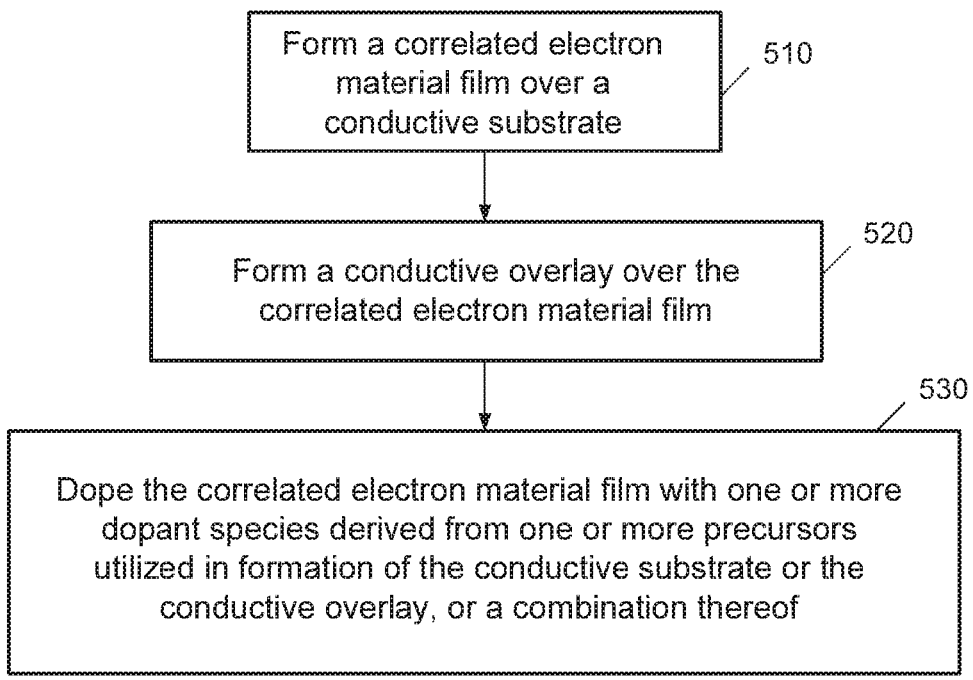

FIG. 5 is a flowchart of an embodiment 500 for a generalized process for fabricating correlated electron materials with reduced interfacial layer impedance. At block 510, one or more layers of CEM film may be formed over a substrate. In an embodiment, a CEM film may comprise one or more materials previously described herein, and claimed subject matter is not limited in this respect. At block 520, one or more conductive materials may be formed over the one or more layers of correlated electron material. In embodiments, a conductive material may operate as an electrode comprising TiN, platinum, copper, aluminum, and so forth. Block 530 may involve doping the correlated electron material film with one or more dopant species derived from one or more precursors utilized in formation of the conductive substrate or the conductive overlay, or a combination thereof. Doping the CEM film and the conductive overlay may involve annealing the conductive overlay and the CEM film to increase pathways for dopant species atoms or molecules diffusing from a conductive overlay to a CEM film, for example.

In particular embodiments, such as those previously described herein, plurality of CEM devices may be formed to bring about integrated circuit devices, which may include, for example, a first correlated electron device having a first CEM and a second correlated electron device having a second correlated electron material, wherein the first and second CEMs may comprise substantially dissimilar impedance characteristics. Also, in an embodiment, a first CEM device and a second CEM device, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a CEM. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a switching device, comprising:
   forming a conductive substrate using one or more precursors;
   forming a correlated electron material film over the conductive substrate; and
   doping the correlated electron material film via diffusing a first dopant species, the first dopant being derived from the one or more precursors, into the correlated electron material film.

2. The method of claim 1, further comprising annealing the conductive substrate to decompose the one or more precursors to supply the first dopant species.

3. The method of claim 2, wherein forming the conductive substrate comprises using an atomic layer deposition process, chemical vapor deposition, plasma chemical vapor deposition, sputter deposition, physical vapor deposition, hot wire chemical vapor deposition, laser enhanced chemical vapor deposition, laser enhanced atomic layer deposition, or rapid thermal chemical vapor deposition, or any combination thereof.

4. The method of claim 1, wherein forming the correlated electron material film over the conductive substrate comprises forming a nickel oxide film.

5. The method of claim 1, wherein forming the conductive substrate comprises forming a conductive substrate of titanium nitride, tantalum nitride, tungsten nitride, or any combination thereof.

6. The method of claim 1, wherein the first dopant species comprises carbon, chlorine, nitrogen, fluorine, cyanide (CN), nitrosyl (NO), ammonia (NH3), oxynitride molecules ($N_xO_y$, wherein x and y comprise whole numbers, and wherein x>0 and y>0 and at least x or y comprise values >0), or molecules of the form $C_xH_yN_z$ (wherein x>0, y>0, z>0, and wherein at least x, y, or z comprise values >0), or any combination thereof.

7. The method of claim 1, wherein the first dopant species comprises a material that brings about a P-type correlated electron material film.

8. The method of claim 1, further comprising forming a conductive overlay over the correlated electron material film.

9. The method of claim 8, further comprising doping the correlated electron material film by diffusing a second dopant species, the second dopant being derived from one or more precursors used in forming the conductive overlay, into the correlated electron material film.

10. A method of fabricating a switching device, comprising:
   forming a correlated electron material film over a conductive substrate;
   forming a conductive overlay over the correlated electron material film; and
   doping the correlated electron material film with one or more dopant species derived from one or more precursors utilized in formation of the conductive substrate or the conductive overlay, or a combination thereof.

11. The method of claim 10, wherein the doping comprises annealing the conductive substrate and the conductive overlay to diffuse the one or more dopant species into the correlated electron material film.

12. The method of claim 11, wherein the annealing comprises diffusing carbon, chlorine, nitrogen, fluorine, cyanide (CN), nitrosyl (NO), ammonia (NH3), oxynitride molecules (NxOy, wherein x and y comprise whole numbers, and wherein x>0 and y>0 and at least x or y comprise values >0), and molecules of the form CxHyNz (wherein x>0, y>0, z>0, and wherein at least x, y, or z comprise values >0), or any combination thereof.

13. The method of claim 10, wherein the one or more dopant species comprises a material that decreases electrical conductivity of the conductive substrate or the conductive overlay, or a combination thereof.

14. The method of claim 13, further comprising the one or more dopant species filling oxygen vacancies in an electron back-donating material of the correlated electron material film.

* * * * *